US007772803B2

(12) United States Patent
Jaeger et al.

(10) Patent No.: US 7,772,803 B2
(45) Date of Patent: Aug. 10, 2010

(54) METHOD AND SYSTEM TO MEASURE SERIES-CONNECTED CELL VOLTAGES USING A FLYING CAPACITOR

(75) Inventors: Ronald H. Jaeger, Indianapolis, IN (US); Chad Hartzog, Kokomo, IN (US)

(73) Assignee: EnerDel, Inc., Indianapolis, IN (US)

( * ) Notice: Subject to any disclaimer, the term of this patent is extended or adjusted under 35 U.S.C. 154(b) by 212 days.

(21) Appl. No.: 11/970,094

(22) Filed: Jan. 7, 2008

(65) Prior Publication Data
US 2008/0164880 A1    Jul. 10, 2008

Related U.S. Application Data

(60) Provisional application No. 60/883,794, filed on Jan. 7, 2007.

(51) Int. Cl.
 *H02J 7/00* (2006.01)
(52) U.S. Cl. .................................. 320/116; 320/166
(58) Field of Classification Search ................ 320/116, 320/134, 166; 324/426
See application file for complete search history.

(56) References Cited

U.S. PATENT DOCUMENTS 5,652,502 A    7/1997    Van Phuol et al.

5,955,869 A    9/1999    Rathmann
6,362,627 B1   3/2002    Shimamoto et al.

FOREIGN PATENT DOCUMENTS

JP    2003240806 A  *  8/2003

OTHER PUBLICATIONS

Machine Translation of JP 2003240806 A. Saigo, Tsutomu. Cell Voltage Measurement Device for Battery Pack and It3 s Method, Aug. 2003.*
PCT/US 08/00197 International Search Report dated Jun. 25, 2008.

* cited by examiner

*Primary Examiner*—Edward Tso
*Assistant Examiner*—Aaron Piggush
(74) *Attorney, Agent, or Firm*—Ice Miller, LLP

(57) ABSTRACT

A method and system for measuring voltage of individual cells connected in series includes a pair of busses connectable to the cells and a flying capacitor connectable to the busses. The capacitor stores the charge of one of the cells such that an analog-to-digital converter (ADC) connected to the capacitor may process an accurate representation of the voltage of the cell being measured. In order to prevent electrical interference with the capacitor and the ADC, the charge on the busses is reduced prior to measurement by the ADC.

9 Claims, 3 Drawing Sheets

METHOD AND SYSTEM TO MEASURE SERIES-CONNECTED CELL VOLTAGES USING A FLYING CAPACITOR

CROSS REFERENCE TO RELATED APPLICATIONS

This application claims the benefit of U.S. Provisional Application No. 60/883,794 filed Jan. 7, 2007, which is incorporated by reference.

BACKGROUND OF THE INVENTION

1. Field of the Invention

The subject invention relates to a method and system for determining a voltage in each cell of a plurality of battery cells connected in series.

2. Description of the Related Art

Electric vehicles and hybrid-electric vehicles typically utilize numerous cells (i.e., batteries) for powering electric drive motors and other electric equipment. These cells are often connected together in a series relationship, as is well known to those skilled in the art, to provide higher voltages.

Due to variations between individual cells, such series-connected cells require periodic balancing, i.e., charge equalization, to maintain a steady voltage and prevent premature failure. One difficulty in cell balancing is determining which cell or cells may need to individually charged or replaced. Therefore, it is necessary to provide a system to determine the voltage in each cell.

Numerous systems and techniques have been developed to address this necessity. Prior art systems often utilize one or more capacitors connected to the cells such that a more stable voltage may be measured. A plurality of busses connect the cells to the capacitor. For instance, U.S. Pat. No. 6,362,627 (the '627 patent) to Shimamoto et al. discloses a system with a plurality of cell switches connected to various cells, a pair of busses connected to the cell switches, a capacitor connected to the busses, and an amplifier connected to the capacitor.

Despite the system described above and others existing elsewhere in the prior art, there remains an opportunity for a method and system for measuring voltage of individual cells connected in series having improved accuracy.

SUMMARY OF THE INVENTION AND ADVANTAGES

The subject invention provides a method of measuring voltage of individual cells in a plurality of cells connected in series. The method includes the step of electrically connecting one of the cells to a capacitor via a plurality of busses disposed between the cells and the capacitor. The method further includes the step of charging the capacitor for a predetermined charge time. In response to an elapse of the predetermined charge time, the capacitor is electrically disconnected from the busses. The method also includes the step of reducing the charge on the busses in response to the electrical disconnection of the capacitor from the busses.

The subject invention also provides a system for measuring voltage of individual cells in a plurality of cells connected in series. The system includes a plurality of cell switches for electrical connection to the plurality of cells. Each cell switch includes a first side and a second side with the first side of each cell switch electrically connectable to a positive terminal of one of the cells. A first bus is electrically connected to the second side of every other cell switch. A second bus electrically connected to the second side of each cell switch not connected to the first bus. The system also includes a capacitor for storing a charge of at least one of the cell. The capacitor includes a pair of terminals. A first bus switch is electrically connected between the first bus and the capacitor for connecting at least one of the cells to the capacitor. A second bus switch electrically connected between the second bus and the capacitor for connecting at least one of the cells to the capacitor. The system also includes a first bus ground switch electrically connected between the first bus and ground and a second bus ground switch electrically connected between the second bus and ground.

The subject invention provides advantages over the prior art. By reducing the charge on the busses, the method and system reduces and/or eliminates electrical interference between the busses and the capacitor. This electrical interference can cause inaccurate readings of the capacitor, and thus, an inaccurate measurement of the voltage on the cell that is being examined. Therefore, by reducing this electrical interference, a more accurate measurement of cell voltage is obtained.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Referring to the Figures, wherein like numerals indicate corresponding parts throughout the several views, a system 10 and method 100 for measuring voltage of individual cells 12 in a plurality of cells connected in series is shown. Those skilled in the art realize that a "cell" is commonly referred to as a "battery". However, for purposes of consistency, the term cell 12 shall be used throughout and should not be regarded as limiting in any way.

Figure 1:
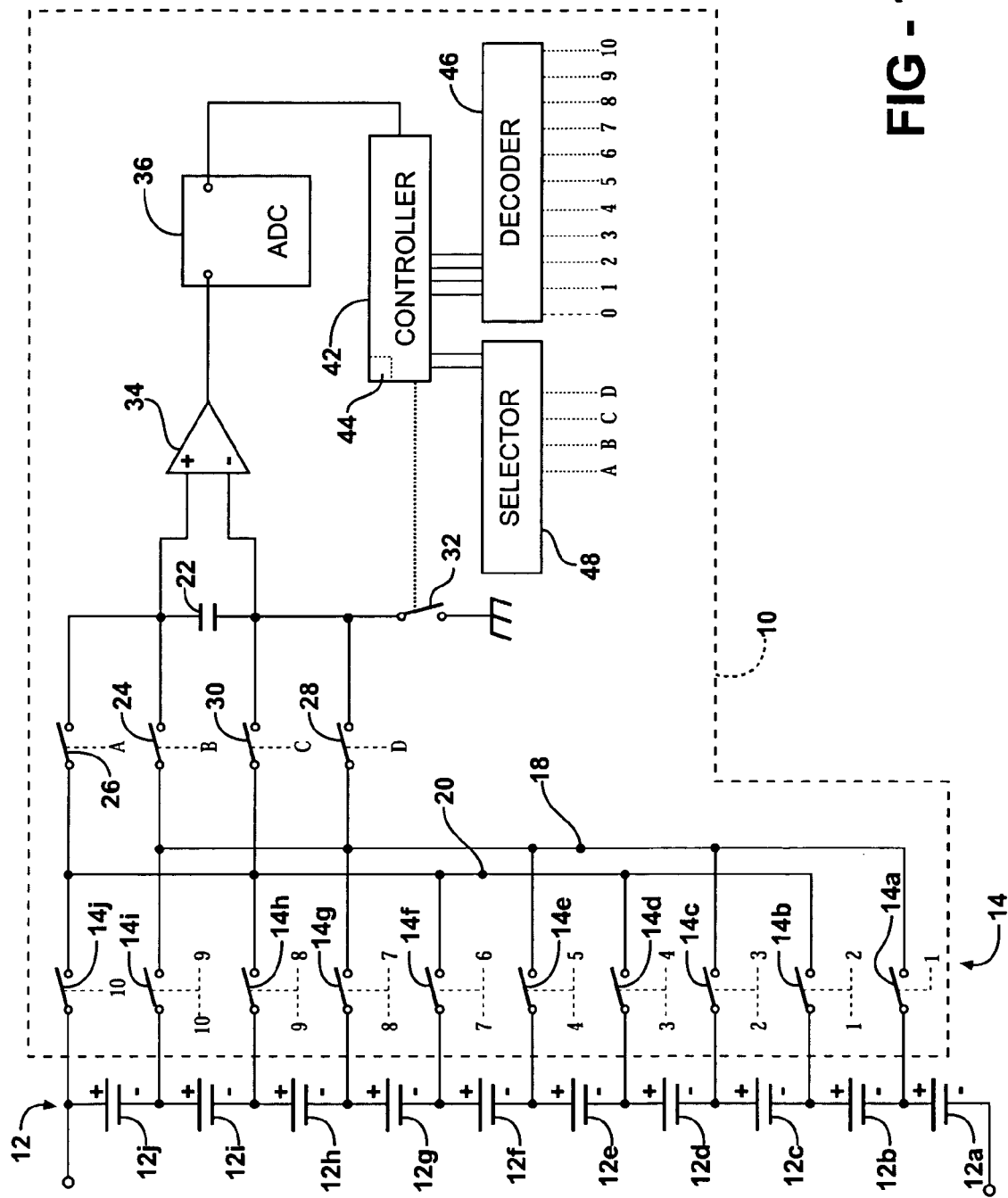
FIG. 1 is a block electrical schematic diagram of a first embodiment of a system of the present invention showing a plurality of cells and the system for measuring a voltage of each individual cell including a flying capacitor and a pair of busses for electrically connecting the cells to the capacitor.
Figure 2:
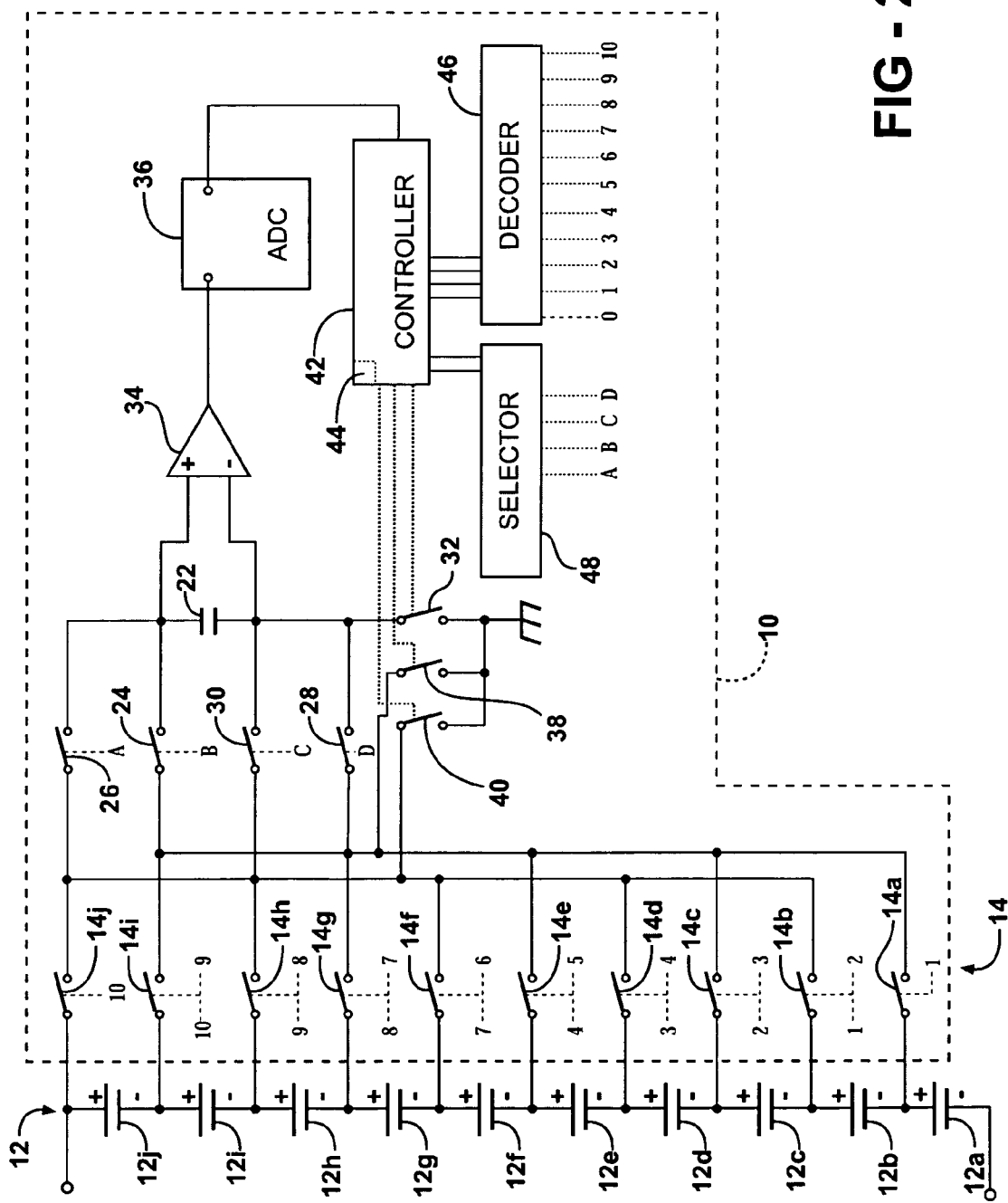
FIG. 2 is a block electrical schematic diagram of a second embodiment of the system of the present invention particularly showing a pair of bus ground switches for electrically connecting the busses to ground.
Figure 3:
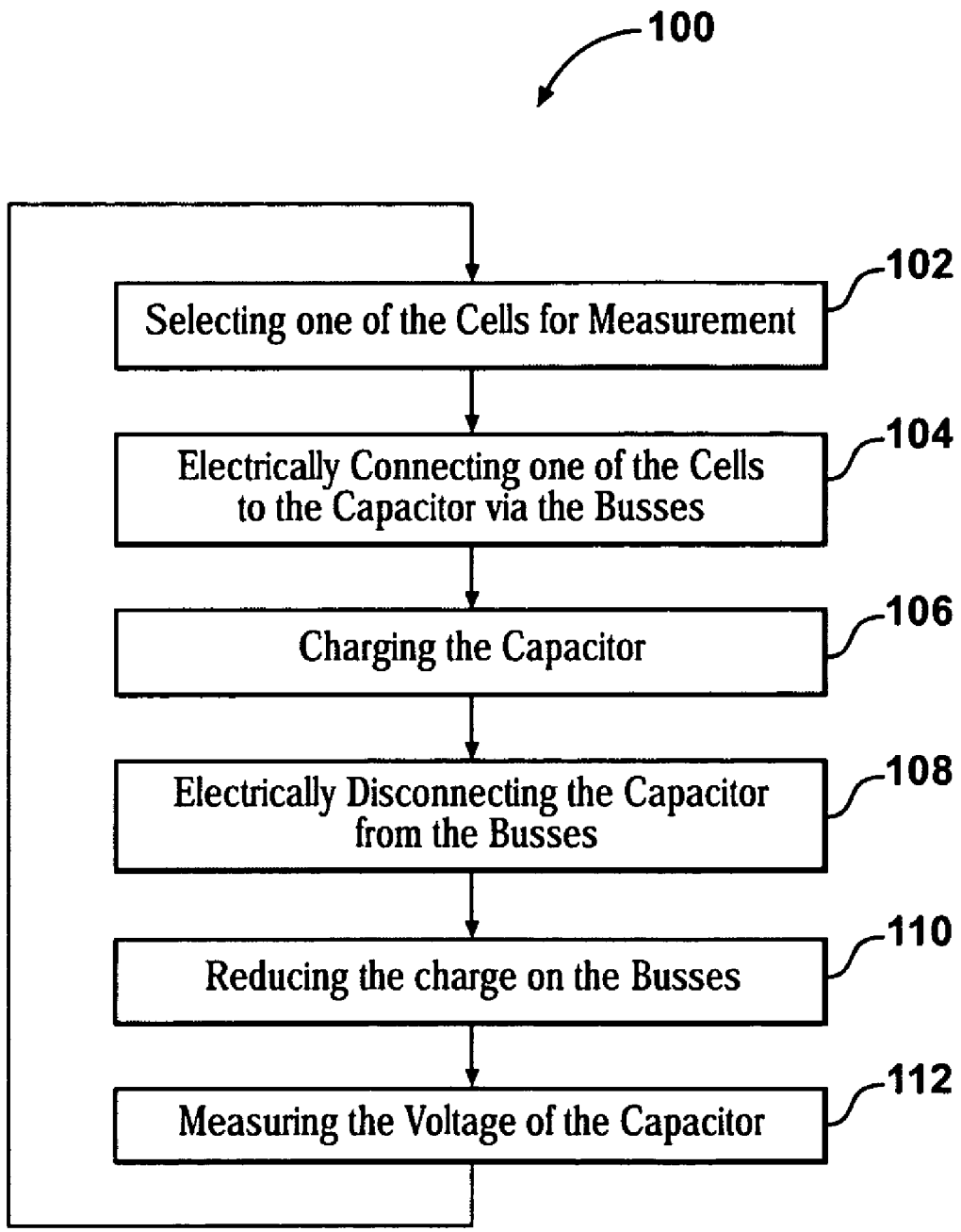
FIG. 3 is a flowchart diagram of a method of the present invention.

FIGS. 1 and 2 show, respectively, first and second embodiments of the system 10 of the present invention. In each of these illustrated embodiments, ten cells 12 are connected in series for providing power to an electrical device, such as, but not limited to, an electric vehicle (EV) or hybrid electric vehicle (HEV). Each cell is preferably a lithium cell with a charged voltage of about 4 volts (V), therefore providing a total voltage of about 40 V. Of course, any number, type, or capacity of cells 12 may be utilized with the subject invention, and the use of ten, lithium, 4 V cells 12 in the illustrated embodiments should not be regarded as limiting. Furthermore, the plurality of cells 12 may be used in other applications outside of a vehicle. For purposes of descriptive clarity, the cells 12 are sequentially on the various Figures from the first cell 12A through a tenth cell 12J.

Each cell 12 includes a positive side (i.e., cathode) and a negative side (i.e., anode) as is known to those skilled in the art. The plurality of cells 12 are electrically connected together in series. That is, a positive side of the first cell 12A is electrically connected to a negative side of a second cell 12B, a positive side of the second cell 12B is electrically connected to a negative side of a third cell 12C, and so on. Typically, where the cells 12 are disposed in a vehicle, the negative side of the first cell 12A is electrically connected to a chassis ground, i.e., the metallic frame of the vehicle. However, there may be situations where the negative side of the first cell 12A is electrically isolated from the chassis ground.

Those skilled in the art appreciate that each cell 12 may actually be several physical cells 12 connected in parallel and operating at the same voltage level for increasing the current capacity of the entire plurality of cells 12 connected in series. Moreover, each cell 12 may actually be several physical cells connected in series.

In the illustrated embodiments, the system 10 includes a plurality of cell switches 14. Each cell switch 14 has a first side (not numbered) and a second side (not numbered), such that electrons may flow between the sides when the cell switch 14 is activated. Conversely, electrons are generally prevented from flowing between the sides when the cell switch 14 is deactivated.

Preferably, the cell switches 14 are implemented utilizing transistors, such that the electrical switching performed by the cell switches 14 can be done without moving parts (i.e., a "solid state" implementation). Most preferably, the cell switches 14 are implemented as a pair of metal oxide silicon field-effect transistors (MOSFETs). Each MOSFET in the pair are preferably a BSS84 P-channel type, which are available from numerous electronics manufacturers. The sources of each MOSFET of the pair are electrically connected together and the gates of each MOSFET are electrically connected together. The drain of one MOSFET acts as the first side of the cell switch 14 and the drain of the other MOSFET acts as the second side of the cell switch 14. The use of MOSFETs, instead of mechanical or relay type switches, greatly reduces implementation cost of the system 10 as well as increases the cycle speed of cell 12 measurement.

However, those skilled in the art realize that each switch could alternatively be implemented with a single MOSFET, a different type of transistor(s), different types of field-effect transistors, a relay, or other suitable switching device. Furthermore, operation of the cell switches 14 (and other switches) herein may be referred to within this application as "opening", "opened", "closed", or "closing", etc., such as is the convention for mechanical type switches. However, this is done for convenience purposes only, and should not be read as limited the cell switches 14 (and other switches) to mechanical type switches.

Preferably, the number of cell switches 14 should equal the number of cells 12 to be measured. Therefore, in the illustrated embodiments, where ten cells 12 are connected in series, ten cell switches 14 are utilized. For purposes of descriptive clarity, the ten cell switches 14 are labeled sequentially from a first cell switch 14A through a tenth cell switch 14I. The first side of each cell switch 14 is electrically connectable to a positive terminal of one of the cells 12.

Also for purposes of descriptive clarity, the first side of the first cell switch 14A is electrically connected to the positive side of the first cell 12A, the second side of the second cell switch 14B is electrically connected to the positive side of the second cell 12B, and so on. Since the cells 12 are electrically connected in series, the first side of the first cell switch 14A is electrically connected to both the positive side of the first cell 12A and the negative side of the second cell 12B. The same reasoning holds true for the other cell switches 14.

The system 10 may also include a plurality of cell switch operation circuits (not shown). Each cell switch operation circuit is electrically connected to at least one cell switch 14 for activating the at least one cell switch 14. In the illustrated embodiments, each cell switch operation circuit may operate a pair of cell switches 14.

Still referring to FIGS. 1 and 2, the system 10 of the illustrated embodiments also includes a first bus 18 and a second bus 20. The first bus 18 is formed by electrical connection of every other cell switch 14, i.e., alternating cell switches 14. The second bus 20 is formed by electrical connection of every cell switch 14 not connected to the first bus 18. In the illustrated embodiments, the first bus 18 electrically connects the second side of the first, third, fifth, seventh, and ninth cell switches 14A, 14C, 14E, 14G, 14I. The second bus 20 electrically connects the second side of the second, fourth, sixth, eighth, and tenth cell switches 14B, 14D, 14F, 14H, 14J are electrically connected together.

The system 10 includes a capacitor 22 for holding a charge corresponding to a voltage of one of the cells 12. The capacitor 22 includes a pair of terminals. For convenience, these terminals are referred to hereafter as a positive terminal and a negative terminal. In the illustrated embodiments, the capacitor 22 has a capacitance of 1 µF (micro Farad). One acceptable capacitor 22 is the ECWU1105KCV, manufactured by Panasonic, and rated for 100 volts DC with a capacitance tolerance of ±10%. Of course, other capacitors 22, with varying capacitances and other physical and electrical characteristics, may also be acceptable. The capacitor 22 may be charged by each of the plurality of cells, as described in greater detail below. Therefore, the capacitor 22 is referred to by those skilled in the art as a "flying capacitor".

The system 10 of the illustrated embodiments further includes four bus switches 24, 26, 28, 30 for coordinating charging of and isolating of the capacitor 22. As with the cell switches 14, each of these bus switches 24, 26, 28, 30 has a first side and a second side. Furthermore, each bus switch 24, 26, 28, 30 is preferably implemented as a pair of MOSFETs, configured in the same fashion as the cell switches 14 described above.

The plurality of bus switches 24, 26, 28, 30 includes a first bus positive switch 24, a second bus positive switch 26, a first bus negative switch 28, and a second bus negative switch 30. The first sides of the first bus positive switch 24 and the first bus negative switch 28 are electrically connected to the first bus 18. The first sides of the second bus positive switch 26 and the second bus negative switch 30 are electrically connected to the second bus 20. The second sides of the first bus positive switch 24 and the second positive switch are electrically connected to the positive terminal of the capacitor 22. The second sides of the first bus negative switch 28 and the second bus negative switch 30 are electrically connected to the negative terminal of the capacitor 22. In an alternative embodiment (not shown), the system 10 may be implemented with only two bus switches, one for each bus 18, 20, instead of the four bus switches 24, 26, 28, 30 of the illustrated embodiments.

The system 10 may also include a ground switch 32. One side of the ground switch 32 is electrically connected to the negative terminal of the capacitor 22 and the other side is electrically connected to ground. Where the system 10 is implemented in a vehicle, the ground is typically the chassis ground. In the preferred embodiment, the negative ground switch 32 is implemented as a BSS145-type MOSFET; however, other suitable MOSFETs may be used. The source of the MOSFET is electrically connected to ground and the drain is electrically connected to the negative terminal of the capacitor 22.

The system 10 preferably includes an amplifier 34 for amplifying the charge stored on the capacitor. In the illustrated embodiments, the amplifier 34 is an operational amplifier (op-amp) 34. For purposes of convenience, the term op-amp 34 will be used hereafter in place of the term amplifier 34; however, this should not be read as limiting in any way. The op-amp 34 includes two inputs (typically referred to as a non-inverting input an inverting input) and an output. In the illustrated embodiments, the op-amp 34 provides an amplified gain from each input to output of 1, otherwise referred to as a unity gain amplifier. One suitable op-amp 34 is an LT1636, available from Linear Technology Corporation of Milpitas, Calif. However, other suitable op-amps 34 or other types of amplifiers 34 may also be implemented.

In the illustrated embodiments, the non-inverting input of the op-amp 34 is electrically connected to the positive terminal of the capacitor 12 and the inverting input of the op-amp 34 is electrically connected to the negative terminal of the capacitor 22. The op-amp 34 amplifies the voltage of the capacitor 22 and produces an amplified voltage signal. The amplified voltage signal is available at the output of the op-amp 34 and proportionally corresponds to the voltage of the capacitor 22, and also, the cell 12 that charged the capacitor 22.

The system 10 also includes an analog-to-digital converter (ADC) 36 in electrical communication with the capacitor 22 for receiving a voltage from the capacitor 22 and converting the voltage into digital data. In the illustrated embodiments, the ADC 36 is electrically connected to the output of the op-amp 34 for converting an analog signal supplied by the op-amp 34 into the digital data. In the illustrated embodiments, the output of the op-amp 34 is directly connected to the ADC 36. However, in an alternative embodiment, a multiplexer (not shown) may utilized between the op-amp 34 and the ADC 36.

In the illustrated embodiments, the ADC 36 includes an input for receiving the analog signal and an output for producing a digital signal carrying the digital data. One suitable ADC 36 is an ADS7829IDRBR manufactured by Texas Instruments of Dallas, Tex. The digital signal of this ADC 36 has a 12-bit resolution and is presented serially at the output. The input of the ADC 36 is electrically connected to the output of the op-amp 34. The ADC 36 receives the amplified voltage signal at the input and produces the digital signal corresponding to the amplified voltage signal. Therefore, the digital data carried by the digital signal proportionally corresponds to the voltage of the capacitor 22 and the cell 12 that charged the capacitor 22. This digital data may be referred to herein as the digital voltage data and the digital signal may be referred to herein as the digital voltage signal.

The electrical charge that occurs on the busses 18, 20 will affect the reading of the voltage of the capacitor 22 by the ADC 36. This situation may occur even when the busses 18, 20 are isolated from the capacitor 22 by all the bus switches 24, 26, 30, 28 being open. This occurs because of the voltage on the busses 18, 20 may be significantly higher than the voltage on the capacitor in concert with the close proximity between the busses 18, 20 and the capacitor 22 and the ADC 36, as well as due to leakage current through the bus switches 24, 26, 30, 28 and capacitance across the bus switches 24, 26, 30, 28. For example, when measuring the tenth cell 12J of the illustrated embodiment, the voltage of the first bus 18 will measure about 36 V and the voltage the voltage of the second bus 20 will measure about 40 V. Therefore, in order to achieve the most accurate voltage reading of the capacitor 22 by the ADC 36, it is preferred that the voltage on the busses 18, 20 be reduced prior to the analyzing of the voltage of the capacitor 22 by the ADC 36.

Various techniques may be employed to reduce the charge on the busses 18, 20 prior to reading the voltage of the capacitor 22. In a first embodiment of the system 10, as shown in FIG. 1, the voltage on the busses 18, 20 is reduced by first opening all of the bus switches 24, 26, 28, 30, i.e., electrically disconnecting the busses 18, 20 from the capacitor 22, and then connecting the lowest voltage cells 12 to each of the busses 18, 20. Specifically, in the first embodiment, the first cell switch 14A is closed to connect the first cell 12A to the first bus 18 and the second cell switch 14B is closed to connect the second cell 12B to the second bus 20. The other cell switches 14C-14J are opened. Therefore, the voltage of the busses 18, 20 will be lower or the same as the voltage across the capacitor 22.

In a second embodiment, as shown in FIG. 2, the system 10 includes a first bus ground switch 38 and a second bus ground switch 40. The first bus ground switch 38 electrically connects the first bus 18 to ground and the second bus ground switch 42 electrically connects the second bus 20 to ground. The first and second bus ground switches 38, 40 may be implemented with MOSFETs, as described above, or other techniques well known to those skilled in the art. In the second embodiment, the charge on the busses 18, 20 is reduced by first opening all of the bus switches and then closing the bus ground switches 38, 40 to discharge the busses 18, 20 by electrically connecting the busses to ground.

The system 10 further includes a controller 42 for controlling operations of the various components of the system 10. The controller 42 may be a microprocessor, microcontroller, computer, application specific integrated circuit (ASIC), or other similar device known to those skilled in the art. In the illustrated embodiments, the controller 42 is a model 68HC908GR32A microcontroller, manufactured by Freescale Semiconductor, headquartered in Austin, Tex. Of course, other controllers would also be suitable.

The controller 42 is in communication with the ADC 36 for receiving the digital data from the ADC 36. Specifically, in the illustrated embodiments, the controller 42 includes a plurality of inputs and outputs. The plurality of inputs including a measurement input for receiving a digital signal. The measurement input is electrically connected to the output of the ADC 36, such that the digital data corresponding to the voltage of the capacitor 22 (and each cell 12) is received by the controller 42. As is well known to those skilled in the art, many controllers have one or more internal ADCs. Therefore, in other embodiments (not shown) the ADC 36 may be integrated within the controller 42.

A memory 44 is in communication with the controller 42 for storing data. This data includes, but is not limited to, the digital data corresponding to the voltage of the each cell 12, i.e., the digital voltage data. The memory 44 may be random access memory (RAM), flash memory, a hard disk, a floppy disk, a compact disk, or any other memory device know by those skilled in the art. Furthermore, the memory 44 may be internal to the controller 42, as is the case with the illustrated embodiments.

In the illustrated embodiments, the controller 42 is in communication with the switches 14, 24, 26, 28, 30, 32, 38, 40 for controlling the operation of the switches 14, 24, 26, 28, 30, 32, 38, 40. With respect to the cell switches 14, four outputs of the controller 42 are preferably electrically connected to a decoder 46. The decoder 46 is preferably a BCD (binary coded digit) to decimal decoder 46, such as a 74HC4028. The preferred decoder 46 includes four inputs electrically connected to the controller 42 and ten outputs (i.e., a first decoder output through a tenth decoder output). Only one output of the decoder 46 is activated based on the BCD provided by the controller 42 to the inputs of the decoder 46. Each of the ten outputs is electrically connected to one of the cell switch operation circuits to operate at least one cell switch 14. In the illustrated embodiments, the first decoder output operates the first cell switch 14A, a second decoder output operates the first and second cell switches 24, a third decoder output operates the second and third cell switches 24, and so on through the tenth decoder output, which operates the ninth and tenth cell switches 24.

In the illustrated embodiments, at least one output of the controller 42 is utilized to control the operation of the bus switches 24, 26, 28, 30. A selector 48 is implemented between the controller 42 and the bus switches 24, 26, 28, 30 to control the bus switches 24, 26, 28, 30. Furthermore, at least one output of the controller 42 is electrically connected to the ground switch 32 to control the operation of the ground switch 32. Moreover, in the first embodiment, at least one output of the controller 42 is electrically connected to the first bus ground switch 38 and the second bus ground switch 40 to control the operation of these bus ground switches 38, 40.

The various components of the system 10 may be mounted on a printed circuit board (PCB), as is well known to those skilled in the art. The PCB is printed, on one or both sides, with a conductive material through a mask. The conductive material electrically connects the various components, such that extensive wiring between the components is not needed. Of course, various other electrical and electronic devices may be utilized in an implementation of the system 10, other than the devices described above. As is well known to those skilled in the art, these devices may include, but are not limited to, resistors, diodes, bipolar-junction transistors (BJTs), and capacitors.

The functionality, advantages, accuracy, and efficiency of the present invention may be better understood when examining the method 100 of determining the voltage of the cells 12. For convenience, the method 100 is described hereafter in terms of the various components of the system 10. However, the method 100, as described and claimed herein, may be practiced in situations outside of the described system 10.

The method 100 may include the step 102 of selecting one of the cells 12 for measurement. In the illustrated embodiments of the system 10, the controller 42, by operation of software, selects which cell 12 is to be measured. Typically, the software in the controller 42 will simply sequence through the cells 12 such that the voltage of each cell 12 is measured in turn. However, in certain situations, the controller 42 may deviate from such sequential operation to focus on a particular cell 12.

The method 100 continues with the step 104 of electrically connecting one of the cells 12 to the capacitor 22 via the busses 18, 20 disposed between the cells 12 and the capacitor 22. Preferably, the cell 12 connected to the capacitor 22 is the selected cell 12 selected in step 102. In the illustrated embodiments of the system 10, the controller 42 operates the various switches 14, 24, 26, 28, 30, 32 based on the selected cell 12, such that the positive terminal of the capacitor 22 is electrically connected to the positive side of the selected cell 12 and the negative terminal of the capacitor 22 is electrically connected to the negative side of the selected cell 12. The controller 42 utilizes the decoder 46 to operate the cell switch 14 or cell switches 14 corresponding to the selected cell 12. The controller utilizes the selector 48 to operate the appropriate bus switches 24, 26, 28, 30.

As an example, when determining a voltage of the first cell 12A, the capacitor 22 must be charged to the voltage of the first cell 12A. Therefore, the first cell switch 14A is closed, while the other cell switches 14B-14J are opened. Since, in the preferred embodiment, the negative side of the first cell 12A is grounded, the controller closes the ground switch 32. The first bus positive switch 24 and the second bus negative switch 30 are closed while the second bus positive switch 26 and the first bus negative switch 28 are open. Thus, the capacitor 22 will charge to the voltage level of the first cell 12A.

As further examples, when the second cell 12B is selected, the first and second cell switches 14A, 14B are closed, while the other cell switches 14C-14J are opened. The second bus positive switch 26 and the first bus negative switch 28 are closed while the first bus positive switch 24, the second bus negative switch 30, and the ground switch 32 are open. Thus, the capacitor 22 will charge to the voltage level of the second cell 12B. When the third cell 12C is selected, the second and third cell switches 14B, 14C are closed, while the other cell switches 14A, 14D-14J are opened. The first bus positive switch 24 and the second bus negative switch 30 are closed while the second bus positive switch 26, the first bus negative switch 28, and the ground switch 32 are open. Thus, the capacitor 22 will charge to the voltage level of the third cell 12C. Obviously, one skilled in the art may determine the appropriate switches 14 to open and close for each other cell 12 using a similar methodology.

The method 100 continues with the step 106 of charging the capacitor for a predetermined charge time such that the voltage level of the capacitor 22 substantially matches the voltage level of the cell 12 that is being measured. Accordingly, the predetermined charge time is based on the electrical characteristics of the cell 12 and the capacitor 22 and is preferably tracked by the controller 42.

In response to the elapsing of the predetermined charge time, the method 100 continues with the step 108 of electrically disconnecting the capacitor 22 from the busses 18, 20. Specifically, in the illustrated embodiments of the system 10, the bus switches 24, 26, 28, 30 are operated such that the capacitor 22 is electrically disconnected from the busses 18, 20.

The method 100 then continues with the step 110 of reducing the charge on the busses 18, 20 in response to the electrical disconnection of the capacitor 22 from the busses. In the first embodiment, the cell switches 14 are operated such that the busses are electrically connected to the cells 12 with the lowest potential. Specifically, the first and second cell switches 14A, 14B are closed while the other cell switches 14C-14J are opened. As such, the busses 18, 20 are discharged to the level of first and second cells 12A, 12B. In the second embodiment, the cell switches 14 are opened and the bus ground switches 38, 40 are closed. Therefore, the busses 18, 20 are discharged to ground.

After discharging the busses 18, 20, the method 100 continues with the step 112 of measuring the voltage of the capacitor 22. In the illustrated embodiments, this step 112 of measuring can be broken down into three sub steps. First, the voltage of the capacitor 22 is amplified to generate an amplified analog voltage signal. As stated above, the amplification of the voltage of the capacitor 22 may be by a factor of 1, so no increase in voltage occurs. Next, the ADC 36 receives the amplified analog voltage signal from the op-amp 34. Accordingly, the amplified analog voltage signal is converted to a digital voltage signal. As stated above, the ADC 36 is electrically connected to, or integrated with, the controller 42. Therefore, the digital voltage signal is communicated to the controller 42. The digital voltage signal encodes digital data that corresponds to the voltage of the capacitor 22, and thus the voltage of the selected cell 12. In response to the controller 42 reading the voltage of the capacitor 22, the voltage, which corresponds to the voltage of the cell 22 being measured, is stored in the memory 44.

The system 10 may also include one or more resistive balancing circuits (not shown) for balancing the cells 12, i.e., adjusting the voltage of each cell 12 so that the voltage of each cell 12 is substantially similar. This adjustment of the cells 12 is preferably based on the voltage readings obtained for each cell 12 as described above.

The present invention has been described herein in an illustrative manner, and it is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. A method of measuring voltage of individual cells in a plurality of cells connected in series, said method comprising:
   electrically connecting one of the cells to a capacitor via a plurality of busses disposed between the cells and the capacitor;
   charging the capacitor for a predetermined charge time;
   electrically disconnecting the capacitor from the busses in response to an elapse of the predetermined charge time; and
   reducing the charge on the busses in response to the electrical disconnection of the capacitor from the busses wherein said step of reducing the charge on the busses includes electrically connecting the busses to the cells with the lowest potential in response to the electrical disconnection of the capacitor from the busses.

2. A method as set forth in claim 1 further comprising the step of measuring the voltage of the capacitor in response to the reduction of the charge on the busses to generate a digital voltage signal.

3. A method as set forth in claim 2 further comprising the step of reading the digital voltage signal by a controller.

4. A method as set forth in claim 1 wherein said step of reducing the charge on the busses is further defined as discharging the busses by electrically connecting the busses to ground in response to the electrical disconnection of the capacitor from the busses.

5. A system for measuring voltage of individual cells in a plurality of cells connected in series, said system comprising:
   a plurality of cell switches for electrical connection to the plurality of cells wherein each cell switch includes a first side and a second side with said first side of each cell switch electrically connectable to a positive terminal of one of the cells;
   a first bus electrically connected to said second side of every other cell switch;
   a second bus electrically connected to said second side of each cell switch not connected to said first bus;
   a capacitor for storing a charge of at least one of the cells wherein said capacitor includes a pair of terminals;
   a first bus switch electrically connected between said first bus and said capacitor for connecting at least one of the cells to said capacitor;
   a second bus switch electrically connected between said second bus and said capacitor for connecting at least one of the cells to said capacitor;
   a first bus ground switch electrically connected between said first bus and ground and a second bus ground switch electrically connected between said second bus and ground, and
   a controller coupled to the first bus switch, second bus switch and plurality of cell switches, said controller being configured to reduce the charge on the busses by configuring the first bus switch, second bus switch and plurality of cell switches to electrically connect the first and second busses to the cells with the lowest potential in response to the electrical disconnection of the capacitor from the busses.

6. A system as set forth in claim 5 further comprising an analog-to-digital converter (ADC) in electrical communication with said capacitor for receiving a voltage from said capacitor and converting the voltage into digital voltage data.

7. A system as set forth in claim 6 said controller is in communication with said ADC for controlling said switches and receiving the digital voltage data provided by the ADC.

8. A system as set forth in claim 5 wherein said first bus switch is further defined as a first bus positive switch electrically connected between said first bus and a positive terminal of said capacitor and a first bus negative switch electrically connected between said first bus and a negative terminal of said capacitor.

9. A system as set forth in claim 7 wherein said second bus switch is further defined as a second bus positive switch electrically connected between said second bus and said positive terminal of said capacitor and a second bus negative switch electrically connected between said second bus and said negative terminal of said capacitor.

* * * * *